United States Patent
Haghiri et al.

(10) Patent No.: US 7,038,128 B2
(45) Date of Patent: May 2, 2006

(54) METHOD OF PRODUCING A MODULE

(75) Inventors: Yahya Haghiri, deceased, late of Munich (DE); by Touba Haghiri-Tehrani, legal representative, München (DE); Renée-Lucia Barak, Unterhaching (DE); Josef Riedel, Attenkirchen (DE)

(73) Assignee: Giesecke & Devrient GmbH, Munich (DE)

( * ) Notice: Subject to any disclaimer, the term of this patent is extended or adjusted under 35 U.S.C. 154(b) by 225 days.

(21) Appl. No.: 10/468,158

(22) PCT Filed: Feb. 28, 2002

(86) PCT No.: PCT/EP02/02185

§ 371 (c)(1),
(2), (4) Date: Dec. 22, 2003

(87) PCT Pub. No.: WO02/071329

PCT Pub. Date: Sep. 12, 2002

(65) Prior Publication Data

US 2004/0099745 A1    May 27, 2004

(30) Foreign Application Priority Data

Mar. 1, 2001 (DE) .................. 101 09 993

(51) Int. Cl.
*H01L 23/29*    (2006.01)
(52) U.S. Cl. .................. 174/52.1; 174/52.2; 174/258; 174/259; 29/740; 235/492
(58) Field of Classification Search ...... 174/52.1–52.4, 174/258, 259; 29/740; 235/492
See application file for complete search history.

(56) References Cited

U.S. PATENT DOCUMENTS

| | | | | | |
|---|---|---|---|---|---|
| 4,766,268 | A | * | 8/1988 | Uggowitzer | 174/256 |
| 4,876,441 | A | * | 10/1989 | Hara et al. | 235/492 |
| 4,897,534 | A | * | 1/1990 | Haghiri-Tehrani | 235/492 |
| 5,079,673 | A | * | 1/1992 | Kodai et al. | 174/52.2 |
| 5,103,293 | A | * | 4/1992 | Bonafino et al. | 174/256 |
| 5,255,430 | A | * | 10/1993 | Tallaksen | 29/827 |
| 5,510,074 | A | * | 4/1996 | Rose | 264/261 |
| 5,774,339 | A | * | 6/1998 | Ohbuchi et al. | 235/380 |
| 5,851,854 | A | | 12/1998 | Haghiri-Tehrani et al. | 438/118 |
| 6,095,423 | A | | 8/2000 | Houdeau et al. | |
| 6,217,685 | B1 | * | 4/2001 | Leydier et al. | 156/73.1 |
| 6,333,466 | B1 | * | 12/2001 | Miyaake et al. | 174/256 |
| 6,412,701 | B1 | * | 7/2002 | Kohama et al. | 235/492 |
| 6,595,426 | B1 | * | 7/2003 | Brunet et al. | 235/492 |

(Continued)

FOREIGN PATENT DOCUMENTS

DE    195 43 427 A1    5/1997

(Continued)

*Primary Examiner*—Dean A. Reichard
*Assistant Examiner*—Adolfo Nino
(74) *Attorney, Agent, or Firm*—Bacon & Thomas, PLLC

(57) ABSTRACT

A method is described for producing a module to be incorporated in a card body wherein a module carrier is provided with a conductive structure on one side. During production of the module carrier, a material whose properties essential for a certain manner of connection with a layer of material of the card body upon incorporation of the module in the card body are adjusted to said layer of material is used at least for a first layer of the module carrier located on the side opposite the conductive structure.

16 Claims, 1 Drawing Sheet

U.S. PATENT DOCUMENTS

| | | | |
|---|---|---|---|
| 6,722,571 B1 * | 4/2004 | Lavrut et al. | 235/492 |
| 6,730,857 B1 * | 5/2004 | Konrad et al. | 174/258 |
| 6,939,737 B1 * | 9/2005 | Palanisamy | 174/254 |

FOREIGN PATENT DOCUMENTS

| | | |
|---|---|---|
| DE | 196 32 115 C1 | 12/1997 |
| DE | 196 32 813 C2 | 2/1998 |
| DE | 197 31 737 A1 | 9/1998 |
| DE | 197 35 387 A1 | 2/1999 |
| EP | 0 359 632 B2 | 3/1990 |
| EP | 0 521 502 B1 | 1/1993 |
| EP | 0 527 438 B1 | 10/1997 |
| EP | 1 033 677 A1 | 9/2000 |
| WO | 97/19463 | 5/1997 |
| WO | 98/07191 | 2/1998 |
| WO | 99/09522 | 2/1999 |

* cited by examiner

METHOD OF PRODUCING A MODULE

BACKGROUND OF THE INVENTION

1. Field

This invention relates to a method for producing a module to be incorporated in a card body wherein a module carrier is provided with a conductive structure on one side. The invention relates in addition to a corresponding module and to a method for incorporating such a module in a card body and a data carrier card having such a module.

2. Related Art

One way of producing data carrier cards that are used for example as identification, credit or debit cards or the like consists in inserting a module containing the actual data carrier and having contact areas for contacting the data carrier in a reading and/or writing device into a specially provided gap in the card body. Such a module generally consists of a "module carrier" or "substrate" having on one side a conductive structure for forming the contact areas. On the other side a chip is usually mounted on the module carrier as a data carrier. The inputs and outputs of the chip are electrically connected with the contact areas through the module carrier. With modules produced at present, the module carrier is usually made of epoxy resin or Kapton and recently also PEN. However, these materials can only be connected adhesively with the card by means of an adhesive layer. A great variety of methods are known for fastening such a module in the gap of the card body by means of an adhesive layer.

Thus, EP 0 521 502 describes a method for incorporating a module in a two-step gap of a card body. First, an annular double-sided contact adhesive element is fastened on the shoulder areas of the deeper gap in the card body. Then, the module is inserted into the gap with the contact areas on the outside, the module being glued in the edge area to the double-sided adhesive element disposed in the shoulder area of the recess.

EP 0 493 738 describes another method for gluing the module to the card body. A thermally activable adhesive layer is positioned on the underside of the module opposite the contact areas. The module is then inserted into the gap of the card body with the adhesive layer and glued by application of heat and pressure.

DE 197 31 737 A1 discloses a method according to the generic part of the independent claims, in particular a method for producing a module to be incorporated in a card body wherein a module carrier is provided with a conductive structure on one side (upper side). In this method, an anchoring element made of a material (e.g. aluminum) having a softening parameter contrary to the material of the card body (e.g. a plastic) is further applied to the underside of the module carrier to which a chip is later applied. This guarantees that when heated the card body softens while the anchoring element remains solid so that it penetrates into an undercut cavity of the card body and can become lodged there.

EP 0 359 632 A1 discloses a further method for producing a module to be incorporated in a card body wherein a module carrier is provided on its underside with anchoring elements that are provided for anchoring in the card body and therefore must not soften.

U.S. Pat. No. 5,851,854 discloses a method for producing a double-layer data carrier with an electronic module wherein a cavity around the module is filled with a material having a low softening temperature. For this purpose the module is disposed in a gap of a first layer so that the cavity remains between the first layer and the module. A second layer is printed in some places with the material having the low softening temperature. The two layers are then assembled so that the material comes to lie on the module. The two layers are then assembled so that the material comes to lie on the module. During subsequent heating, the material softens and penetrates into the cavity between the module and the first layer. This causes the module and the double layer to be glued together.

A disadvantage of these gluing methods is that despite all efforts to find a good adhesive for embedding modules in the card body, this bond always constitutes a weak point. The reason is that the adhesive must enter into a good bond both with the material of the module carrier and with the material of the card body. Since these materials are always different, a compromise must be made when selecting the adhesive.

It is the problem of the present invention to provide an alternative to this stated prior art.

According to the invention, during production of the module carrier a material consisting of thermoplastic whose properties essential for a certain manner of connection, for example thermowelding, with a layer of material of the card body upon incorporation of the module in the card body are adjusted to said relevant layer of material of the card body to the extent that the plastics have a similar softening parameter is used at least for a first layer of the module carrier located on the underside opposite the conductive structure. This permits very simple and reliable welding of the plastics to each other. That is, the ultimately adhesive layer of the module carrier is already applied "inline" during production of the module, and the properties of the connecting layer at the same time adjusted quite specifically to the card material with which the connection is to be entered into, and to the manner of connection.

This adaptation of the layer of the module carrier to be connected with the card body to the material of the card body thus permits an optimal bond to be obtained. Moreover, it permits glueless connection methods such as welding of the plastics, in which methods the quality of the connection depends very importantly on the properties of the materials to be connected. Such glueless connections are especially advantageous since they do without the additional working step of applying the adhesive layer during production of the data carrier cards. This makes the implantation process shorter, which entails considerable cost advantages.

Which softening parameters are specifically involved in the method depends on the particular desired welding technique. Thus, upon application of the thermowelding process the material of the module carrier is selected so that the softening temperatures of the two plastics are equally high if possible. For ultrasonic welding, high-frequency welding or vibration welding, the plastics should soften at similar frequencies.

In an especially preferred example, the module carrier consists on the underside opposite the conductive structure of the same material as the layer of material of the card body to be connected with the module carrier upon incorporation. In this case the properties are not only adjusted to each other, but even identical. Any of the abovementioned welding processes can therefore be used for example for connecting the module with the card body. Adjustment of this kind also has advantages for the conventional manner of connection by means of adhesive, since an adhesive can be selected that is precisely adjusted to this one material, so that no compromise between different materials to be connected must be made with respect to the selected adhesive.

In the simplest example, the module carrier has a single layer. That is, it consists only of a single layer consisting of the specially selected material with the properties adapted to the card body.

Further, the module carrier can also be produced of two layers, so that between the first layer to be connected with the card body and the conductive structure there is a second layer consisting of a material whose properties are again adjusted to the requirements in further processing of the module carrier, e.g. to application of a conductive structure. For this layer the material can be selected for example so that the total module has a certain mechanical stability necessary for later processing. Two-layer module carriers can be produced very simply by the coextrusion technique.

In a further example, these first and second layers are interconnected by at least one connection layer, for example an adhesive layer. In this case, the module carrier thus has at least three layers. Three-layer module carriers can be produced very simply as laminated films.

Preferably, the inventive modules are produced precisely like conventional modules in the form of an endless or continuous module tape. Such a module tape has a module carrier tape to which conductive structures are accordingly applied for a plurality of modules disposed along the module tape. The ultimately connecting layer of the module carrier tape, i.e. the layer opposite the conductive structures, is produced here "inline" during production of the module carrier tape and thus integrated directly into the module carrier tape. This module tape is then further processed like a conventional, known module tape, i.e. for example the chips are applied, the contacting produced and the chips cast by the usual methods. The individual modules are then detached from the module carrier, preferably being punched or cut out.

Such "inline" production of the connection layer in the module tape is possible with a multilayer module carrier tape for example using a coextrusion technique. As an alternative, such a multilayer module carrier tape can be produced by a laminating technique, i.e. in the form of an endless laminated film tape. This method is recommendable in particular for the production of module carrier tapes having connection layers between the individual functional layers of material, i.e. for the three- or multilayer version.

DESCRIPTION OF THE DRAWINGS

The invention will hereinafter be explained in more detail by examples with reference to the enclosed figures, in which.

DETAILED DESCRIPTION OF THE PREFERRED EMBODIMENTS

Figure 1:
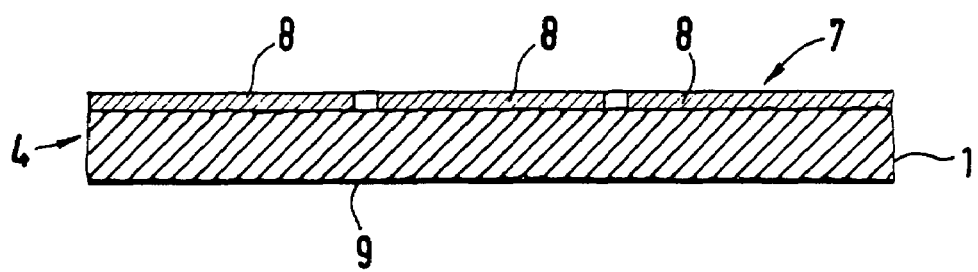
FIG. 1 shows a schematic cross section through a module tape with a single-layer module carrier tape.

The module tape shown in FIG. 1 in cross section, i.e. across the longitudinal direction, has module carrier tape 4 with only one layer 1. On the upper side, module carrier tape 4 is connected with conductive structure 7. This conductive structure has a plurality of contact areas 8 that later serve as contacts for reading a chip of the module by means of a reading device.

Single layer 1 of module carrier tape 4 is selected of a material that is adjusted to the material of the card bodies (not shown) in which the modules are later to be incorporated. The extent to which this adjustment is effected, or which parameters are adjusted to each other, depends on what connection technique is used. In the shown example, layer 1 is a thermoplastic. It is therefore possible to weld this layer 1 to the material of the card body, which normally likewise consists of thermoplastic. In this case, if a thermowelding process is used, the thermoplastic for layer 1 is selected so that the softening temperature approximately matches the softening temperature of the plastic of the card body. If other processes are used, for example ultrasonic, high-frequency or vibration welding, however, the material selected for layer 1 of module carrier 4 softens at approximately the same frequencies as the plastic of the card body.

Ideally, layer 1 of module carrier 4 is produced of the same material as the card body itself if possible. In this case, an optimal bond is attainable between the materials. The materials used for layer 1 of module carrier tape 4 are preferably PETG, TPE (thermoplastic elastomer) or ABS.

Figure 2:
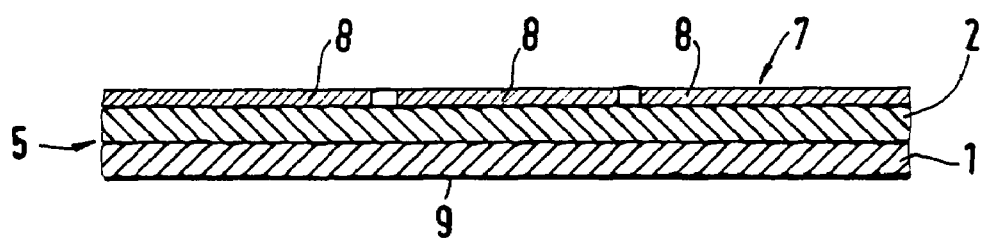
FIG. 2 shows a schematic cross section through a module tape with a two-layer module carrier tape.

FIG. 2 shows a further example in which module carrier tape 5 consists of two single layers 1 and 2. First layer 1 located on underside 9 opposite conductive structure 7 is adapted to the material of the card body, as in the example according to FIG. 1. Second layer 2 located between conductive structure 7 and this first layer 1, however, is selected of a material whose properties are adjusted to further processing as a module carrier.

Production of such a module carrier tape 5 can be done for example by a coextrusion technique by which these layers are extruded one directly above the other in an endless tape through two suitably disposed dies, thereby simultaneously effecting the connection. Upper layer 2 is then provided with conductive structure 7.

For first layer 1 the materials PETG, TPE or ABS are again preferably used, but for second layer 2 preferably the materials PEN, PET or PC. The following combinations have proved especially suitable:

| Examples | First layer | Second layer |
| --- | --- | --- |
| Example No. 1 | PETG | PEN |
| Example No. 2 | PETG | PET |
| Example No. 3 | TPE | PEN |
| Example No. 4 | TPE | PET |
| Example No. 5 | ABS | PC |

Figure 3:
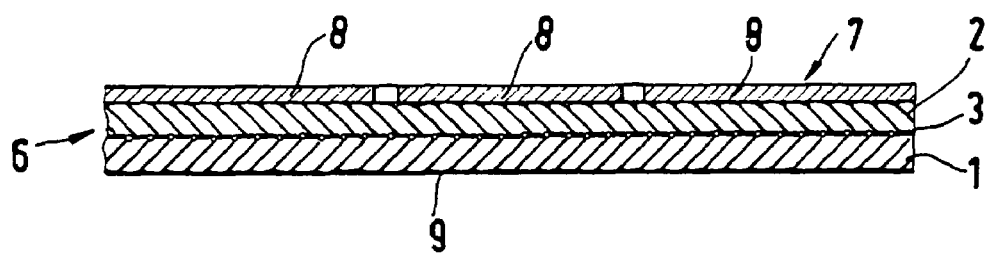
FIG. 3 shows a schematic cross section through a module tape with a three-layer module carrier tape.

FIG. 3 shows module carrier tape 6 constructed of three layers 1, 2, 3. As in the example according to FIG. 2, lowermost first layer 1 disposed on underside 9 opposite conductive structure 7 is layer 1 that is adjusted to the material of the card body for the special manner of connection. This may be a thermoplastic, preferably ABS, PVC or PETG. Likewise, as in the example according to FIG. 2, the second layer located on conductive structure 7 is selected of a material whose properties are especially suitable for processing as a module. The materials PEN or Kapton are preferably used here. The middle layer serves as connection layer 3 between first layer 1 and second layer 2. This may be an adhesive layer, for example a one- or two-component acrylate adhesive or a one- or two-component PU system. Such a module carrier tape 6 can be produced for example as an endless laminated film tape by first layer 1 and second layer 2 being brought together while supplying connection layer 3, and laminated together under pressure. Conductive structure 7 is then applied to second layer 2.

Particularly preferred combinations are:

| Examples | First layer | Connection layer | Second layer |
| --- | --- | --- | --- |
| Example No. 1 | ABS or PVC or PETG | Acrylate adhesive (1C/2C) | PEN |
| Example No. 2 | ABS or PVC or PETG | Acrylate adhesive (1C/2C) | Kapton |
| Example No. 3 | ABS or PVC or PETG | PU systems (1C/2C) | PEN or Kapton |

A module tape stated according to any of the aforementioned examples can be further processed like a conventional module tape. Thus, a chip can be easily applied, a through connection of the inputs and outputs of the chip to contact areas 8 of conductive structure 7 produced, and the chip then cast. The individual modules are then detached from module carrier tape 4, 5, 6, preferably being punched out.

Thus, no further-reaching changes in the usual procedures for producing modules from a module carrier tape are required. Departing from conventional production lines for data carrier cards, however, the additional work station of adhesive lamination can be omitted when incorporating the finished chip modules in the card bodies, which makes the production line simpler and more cost-effective compared to conventional production lines.

The invention claimed is:

1. A method for producing a module to be connected to a thermoplastic layer of a card body intended to receive said module, comprising:
    forming a module carrier having a conductive structure extending substantially entirely over one side thereof;
    during forming of the module carrier, forming a first thermoplastic material bottom layer on a side of the carrier opposite the side provided with the conductive structure;
    wherein said thermoplastic material bottom layer is selected to have a similar softening temperature as of a thermoplastic card body layer to which the carrier is to be connected.

2. The method according to claim 1, wherein said first thermoplastic material bottom layer is selected to be the same material as the thermoplastic card body layer to which the module is connectable.

3. The method according to claim 1, wherein said first thermoplastic material bottom layer is the only layer constituting the carrier.

4. The method according to claim 1, including forming said module carrier of at least two layers, one of which comprises said first thermoplastic material bottom layer and a second layer intermediate said first thermoplastic material bottom layer and said conductive structure, and including the step of selecting the material of said second layer so that it possess properties adjusting said second layer to further processing of the module carrier.

5. The method according to claim 4, including connecting said first thermoplastic bottom layer and said second layer using at least one connection layer.

6. The method according to claim 1, including forming said module carrier from a continuous tape on which a plurality of said conductive structures are applied, said continuous tape comprising at least said first thermoplastic material bottom layer; further processing said continuos tape with conductive structures thereon; and thereafter dividing said continuous tape with conductive structures thereon into individual modules.

7. The method according to claim 6, including, as part of the forming step, co-extruding said continuous tape in multiple layers, one of said layers comprising said first thermoplastic material bottom layer.

8. The method according to claim 6, including, as part of the forming of the module carrier step, laminating multiple layers together, one of the laminated multiple layers comprising said first thermoplastic material bottom layer.

9. A module connectable to a thermoplastic layer of a card body intended to receive said module, said module comprising a module carrier having a conductive structure extending substantially entirely over one side thereof, and a bottom side opposite the conductive structure, said bottom side comprising a thermoplastic material bottom layer connectable to a thermoplastic layer of a card body intended to receive said module, said thermoplastic material bottom layer having selected properties enabling said module carrier to be adjusted to said thermoplastic layer of the card body, at least one of said properties being a similar softening temperature as said thermoplastic layer of the card body.

10. The module according to claim 9, wherein said thermoplastic layer of a card body to which the module is connectable is made of the same material as said thermoplastic material bottom layer.

11. The module according to claim 9, wherein said module carrier is formed as a single layer.

12. The module according to claim 9, wherein said module carrier is formed as a plurality of layers including at least one layer intermediate said thermoplastic material bottom layer and said conductive structure, said intermediate layer comprising a material having selected properties enabling the module carrier to be further processed.

13. The module according to claim 12, including at least one connection layer between said thermoplastic material bottom layer and said at least one intermediate layer.

14. A method for forming a card body having a module connected thereto, comprising:
    selecting a module constructed according to claim 9,
    welding the thermoplastic material bottom layer to a thermoplastic layer comprising a card body.

15. The method according to claim 14, wherein the welding is carried out using a welding process selected from the group consisting of thermo, ultrasonic, high frequency and vibration.

16. A data carrier card comprising a module made in accordance with claim 9.

* * * * *